METHOD OF MANUFACTURING A BARRIER LAYER FIELD-EFFECT TRANSISTOR

Filed July 28, 1971

3,813,291

METHOD OF MANUFACTURING A BARRIER LAYER FIELD-EFFECT TRANSISTOR

Vishnuprakash Joshi, Heilbronn-Bockingen, Germany, assignor to Licentia Patent-Verwaltungs-G.m.b.H., Frankfurt am Main, Germany Filed July 28, 1971, Ser. No. 166,667
Claims priority, application Germany, July 29, 1970, P 20 37 589.7
Int. Cl. H01l 7/50
U.S. Cl. 117—212 7 Claims

ABSTRACT OF THE DISCLOSURE

A method of manufacturing a barrier layer field effect transistor comprises producing a contact making window in an insulating layer on a semiconductor body, which window is wider than the width of the control electrode to be produced, producing a metal layer at least in the window, covering the metal layer with a masking layer resistant to etching in the region of the window and of a width larger than the width of the electrode to be produced, etching away the excess metal from the metal layer and under etching the metal layer to produce a control electrode narrower than the masking layer.

BACKGROUND OF THE INVENTION

The invention relates to a method for manufacturing a barrier-layer field-effect transistor in which the control electrode consists of a metal semi-conductor contact with rectifying effect.

Known barrier layer field-effect transistors consist, for example, of a channel with n-type conductivity, to which are connected the source electrode and the drain electrode at a certain distance from each other. This channel with n-type conductivity is surrounded by highly doped zones of p-type conductivity, forming the control electrode of the field-effect transistor. The current flux in the conducting channel of these transistors is formed by varying the space charge zone starting from the p-n junction.

Recently, field-effect transistors have become known in which the barrier layer between a zone of n-type conductivity and a zone of p-type conductivity has been replaced by a metal-semiconductor junction with rectifying action. In literature, such metal semiconductor contacts are often referred to as Schottky contacts. For making field effect transistors with as large a cut off frequency as possible, the barrier layer capacitance of the control electrode should be as small as possible. The maximum possible cut off frequency is obtained by selecting the length of the control electrode as long as possible, and the width of the control electrode and thereby also the length of the channel as small as possible. Tests have already been made with a view to realizing small control electrodes and thus also short channel lengths. In one case, the projection masking technique was used in order to realize small structures, but this is unsuitable for producing structures of various small sizes.

SUMMARY OF THE INVENTION

The object of the invention is to solve the problem of realizing small control electrodes in field-effect transistors by utilizing an entirely different process, which permits the manufacturing of control electrodes of any desired degree of smallness in a simple manner.

According to a first aspect of the invention, there is provided a method for manufacturing a barrier-layer field-effect transistor in which first an insulating layer is formed on a semiconductor body and a control electrode contact making window is produced in the insulating layer, which window is wider than the width of a control electrode to be produced. A metal layer is applied at least in the contact making window. This metal layer is covered with a masking layer which is resistant to etching in the region of the window and wider than the width of the control electrode to be produced and the metal layer is then etched in order to remove excess metal and under etched to produce a control electrode narrower than the masking layer.

According to a second aspect of the invention, there is provided a method for manufacturing a barrier-layer field-effect transistor in which first an insulating layer is formed on a semiconductor body and contact making windows are produced in the insulating layer for a control electrode, a source electrode and a drain electrode. The control electrode contact making window which is produced is wider than the width of the control electrode which is to be produced. A metal layer of a metal having rectifying properties with the semiconductor body is applied over the semiconductor body at least in the said contact making windows. This metal layer is covered with a masking layer resistant to etching in the region of the contact making windows of a width in the region of the contact making window for said control electrode wider than said control electrode which is to be produced. This metal layer is then etched to remove excess metal and at least the part of the metal layer in the contact making window for the control electrode is underetched in order to produce a control electrode narrower than the masking layer in the region of the contact making window for the control electrode. The masking layer is removed and the control electrode is covered with a further insulating layer. A further metal layer is applied to the metal layer remaining in the contact making windows for the source and drain electrodes which transforms the metal layer remaining in said contact making windows for the source and drain electrodes in a subsequent step into barrier-layer-free contacts.

BRIEF DESCRIPTION OF THE DRAWINGS

The invention will now be described in greater detail, by way of example, with reference to the drawings, in which.

DESCRIPTION OF THE PREFERRED EMBODIMENTS

Figure 1:
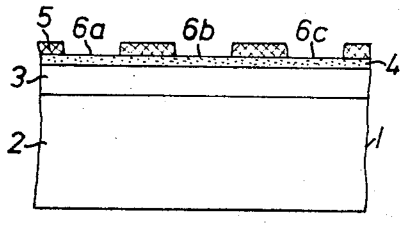
FIG. 1 shows, in section, a first stage in the manufacture of a barrier-layer field-effect transistor in accordance with the invention.

Basically, in accordance with the invention, in the manufacturing of a barrier layer field-effect transistor of the kind described above, a window for a control electrode is provided in an insulating layer applied to the surface of a semiconductor body, which window is wider than the control electrode to be mounted. Then the semiconductor surface in the window is covered with a metal layer having rectifying properties together with the semiconductor body. This metal layer is covered, in the zone provided for the control electrode, with an etching-resistant masking layer which is wider than the control electrode to be fitted. Finally, the surplus parts of the metal layer are removed and the masking layer is underetched so far until a control electrode of the desired width has been formed.

The method in accordance with the invention has the advantage that the structures for the contact making window of the control electrode in the insulating layer and for the making of the metal layer are large enough to be capable of being realized without any difficulties by conventional photo-resist and etching techniques. Only in the very last manufacturing phase of the control electrode, the width of this control electrode is reduced by a simple etching process to the desired, very small dimension, while the residual width of the control electrode depends on the duration of the etching and may therefore easily be varied.

The zones of the semiconductor surface and of the control electrode itself, uncovered by this etching process, are preferably covered with an insulating layer which prevents interfering atoms or molecules from the environment from being deposited on the control electrode and on the surface of the semiconductor, which would have a negative effect on the characteristics of the component.

The masking layer resistant to etching consists preferably of photo-resist which can be easily formed with sharp outlines by exposure and developing techniques.

The etching resistant layer may, in another embodiment, consist of a noble metal which is not attacked by the etching solution used in the process.

In a preferred embodiment of the method according to the invention the first contact layer for the barrier-layer-free contacts of the source and drain electrodes is produced simultaneously with the control electrode. These contacts, which consist in this case of the material of the control electrode and, therefore, together with the semiconductor body have rectifying (diodic) properties, must obviously be transformed into ohmic or barrier-layer-free contacts. This is achieved by covering the control electrode and naturally also the exposed zones of the semiconductor surface, surrounding the control electrode, with an insulating layer. Then, a second metal contact layer is applied to the first metal layer of the source and drain electrodes, which transforms during a subsequent tempering the first contact layer with rectifying action into a barrier-layer-free contact.

The insulating layer covering the control electrode consists preferably of silicon dioxide or of silicon nitride.

In a preferred embodiment of the method of the invention, it has proved useful to use for the first contact layer of the source and drain electrodes, identical with the control electrode, the metal palladium, and gold for the second metal layer.

By means of the method according to the invention, it was possible to produce control electrodes with a width between 1 and 1.5 μm. In this manner, elements are obtained with a cut off frequency of several GHz. The blocking currents of these elements are very small and have the order of magnitude of about 10 μA. The possible breakthrough voltage was about 80 volts.

Referring now to the drawings, in FIG. 1 a semiconductor body 1, is used, consisting for example of silicon and shown in cross-section. The semiconductor body may consist, for example, of a base body 2 with p-type conductivity and an epitaxial layer 3 or n-type conductivity mounted on the base body. In this case, the epitaxial layer 3 forms the conducting layer which will generally have the thickness of only a few tenths μm.

This semiconductor layer with n-type conductivity is covered with an insulating layer 4, consisting, for example, of silicon dioxide or silicon nitride.

This layer may be applied by evaporation, sputtering, or precipitated by chemical reaction. If it is made of silicon dioxide it can also be produced by thermal or anodic oxidation.

Figure 2:
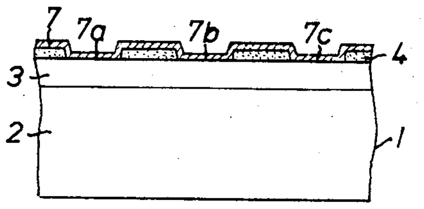
FIG. 2 is a view similar to FIG. 1, but showing a second stage in the manufacture.

The insulating layer 4 is covered with a layer of photo-resist 5 which is so exposed and developed that openings 6a to 6c are formed in the photo-resist above the zones provided for the control electrode, the source electrode, and the drain electrode. During a subsequent etching process, these openings 6 through the oxide layer 4 are extended to the semiconductor surface, as may be seen from FIG. 2.

After the removal of the photo-resist, the surface of the semiconductor arrangement provided with the structured oxide layer 4 receives a metal layer 7, which forms in the openings 6a to 6c in the oxide layer 4, rectifying contacts 7a to 7c in conjunction with the semiconductor surface. The contact 7a and 7c are parts of the source and drain electrodes of the field-effect transistor, while the contact 7b forms the control electrode, which, however, is still too wide. The opening 6b (FIG. 1) provided for the control electrode in the oxide layer 4 is preferably chosen to have a width of several μm. This width is obviously the same as that of the rectifying metal contact 7b.

In this connection it should be stressed that the drawings indicate always only the width of the control electrode, and therefore, the channel length, whilst in the direction perpendicular to the plane of the drawing, the control electrode is usually very long, having a length of, for example, 200 to 500 μm.

Figure 3:
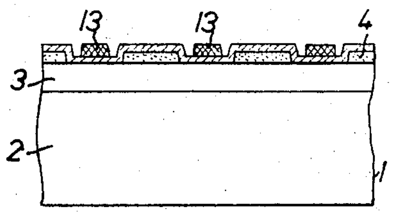
FIG. 3 is a view similar to FIG. 1, but showing a third stage in the manufacture.
Figure 4:
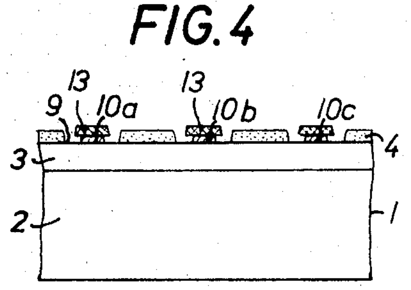
FIG. 4 is a view similar to FIG. 1, but showing a fourth stage in the manufacture.

The metal layer 7 which may consist of palladium is again masked with photo-resist which is exposed and developed in such a manner that a photo-resist web 13 remains over the zone provided for the control electrode 7b (10b in FIG. 4), as shown in FIG. 3, wherein this web is wider than the intended control electrode 10b. For the sake of simplicity, identical webs of photo-resist are also made in the zones of the metal layer 7 provided for the source and drain electrodes 7a and 7c. All other parts of the surface remain unmasked, so that, during a subsequent etching, the surplus parts of the metal layer are removed from the insulating layer 4 and from parts of the semiconductor surface in the contacting windows. During this the webs 13 of photo-resist are under-etched, so that there remain very narrow contact webs 10a and 10c for the source and drain electrodes, and a narrow control electrode 10b. FIG. 4 shows a semiconductor arrangement in this manufacturing stage. The amount of under-etching is a function of the duration of the etching process. During tests control electrodes were made with a width between 1 and 1.5 μm. However, it is perfectly feasible to produce even narrower control electrodes with longer etching periods.

The etching process, and the under-etching of the masking layer 13 exposes parts 9 of the semiconductor surface. By way of example, aqua regia may be used for etching. Where a metal mask of noble metal is used instead of a photo-resist mask, other etching agents are preferably used which do not attack the masking layer of metal.

Figure 5:
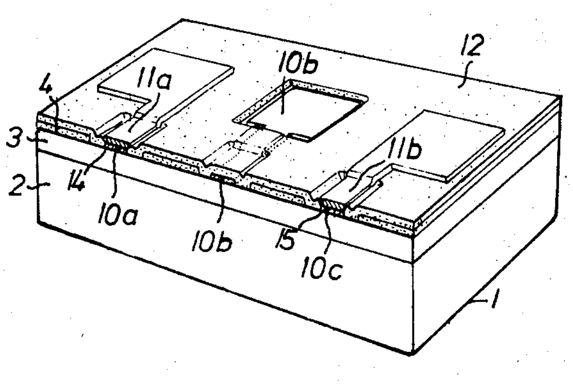
FIG. 5 is a part sectional part perspective view of a completed transistor.

After the etching away of excess metal parts from the semiconductor surface, the masking layer 13 is also removed by a suitable solvent. As shown in FIG. 5, a passivating layer is applied to the semiconductor surface and particularly over the control electrode and the exposed zones of the semiconductor body surrounding the control electrode. FIG. 5 shows the finished semiconductor body partly in cross-section and partly in perspective. The passivating layer 12 may consist, for example, of silicon dioxide or of silicon nitride, and is produced by evaporation or by sputtering. The passivating layer protects the semiconductor surface and the control electrode against interfering atoms or interfering molecules from the surroundings of the semiconductor arrangement. Above the source and drain electrodes, the passivating layer 12 has an opening extending to the contact layer 10a and 10c respectively, in which a second metal layer 11a and 11b respectively is produced by a following evaporation or precipitation process. This second metal layer must have the property of forming an intermetal compound with the first metal layer during a subsequent tempering, thereby ensuring a good ohmic transition to the semiconductor zone 3. During the tempering it is not necessary to reach the alloying temperature. It is sufficient to produce a temperature below the alloying temperature, at which the components of the metal layers diffuse into each other. In a preferred embodiment, the second metal layers 11*a* and 11*b* consist of gold and forms with the first metal layer of palladium after the tempering the ohmic contacts 14 and 15 of the source and drain electrodes.

The control electrode 10*b* extends preferably at one point over the insulating layer 4 and is there connected electrically at a point not covered by the insulating layer 12.

Obviously, the method according to the invention may be applied to all types of barrier-layer field-effect transistors with control electrodes with Schottky effect contacts, such as, for example, to tetrodes or to transistors forming parts of integrated circuits.

It will be understood that the above description of the present invention is susceptible to various modifications changes and adaptations.

What is claimed is:

1. A method for manufacturing a barrier-layer field-effect transistor comprising the steps of forming an insulating layer on a semiconductor body, making a control electrode contact making window in said insulating layer, which window is wider than the desired width of a control electrode to be produced, producing a metal layer, having rectifying properties with said semiconductor body, at least in said contact making window, covering said metal layer with a masking layer resistant to etching in the region of said window and wider than the desired width of said control electrode to be produced, etching said metal layer to remove excess metal and under etching said metal layer to produce a control electrode narrower than said masking layer.

2. A method as defined in claim 1, and comprising covering said metal layer with a layer of photo-resist as said masking layer.

3. A method as defined in claim 1, and comprising covering said metal layer with a layer of noble metal as said masking layer.

4. A method of manufacturing a barrier-layer field-effect transistor comprising the steps of forming an insulating layer on a semiconductor body, making contact making windows for a control electrode, a source electrode and a drain electrode in said insulating layer, the control electrode contact making window being wider than the desired width of said control electrode which is to be produced, producing a metal layer of a metal having rectifying properties with said semiconductor body over said semiconductor body at least in said contact making windows, covering said metal layer with a masking layer resistant to etching in the region of said contact making windows and of a width in the region of said contact making window for said control electrode wider than that desired for said control electrode which is to be produced, etching said metal layer to remove excess metal, under etching at least the part of said metal layer in said contact making window for said control electrode to produce a control electrode narrower than said masking layer in the region of said contact making window for said control eelctrode, removing said masking layer, covering said control electrode with a further insulating layer, applying a further metal layer to said metal layer remaining in said contact making windows for said source and drain electrodes which transforms said metal layer remaining in said contact making windows for said source and drain electrodes in a subsequent step into barrier-layer-free contacts.

5. A method as defined in claim 4, and comprising covering said control electrode with a layer of silicon dioxide as said further insulating layer.

6. A method as defined in claim 4, and comprising covering said control electrode with a layer of silicon nitride as said further insulating layer.

7. A method as defined in claim 4, wherein said metal layer is palladium and said further metal layer is gold.

References Cited

UNITED STATES PATENTS

| | | | |
|---|---|---|---|
| 3,616,380 | 10/1971 | Lepsetter et al. | 317—235 |
| 3,639,186 | 2/1972 | Forster et al. | 317—235 |
| 3,490,943 | 1/1970 | De Werdt | 156—8 X |
| 3,551,196 | 12/1970 | Herczog et al. | 156—17 X |
| 3,515,607 | 6/1970 | Wanesky | 156—17 |
| 3,607,480 | 9/1971 | Harrap et al. | 156—17 |
| 3,244,555 | 4/1966 | Adam et al. | 117—212 |
| 3,290,570 | 12/1966 | Cunningham et al. | 317—240 |

RALPH S. KENDALL, Primary Examiner

U.S. Cl. X.R.

156—17; 117—217; 317—235 UA